United States Patent [19]

Asakura et al.

[11] Patent Number: 4,939,564
[45] Date of Patent: Jul. 3, 1990

[54] GATE-CONTROLLED BIDIRECTIONAL SEMICONDUCTOR SWITCHING DEVICE WITH RECTIFIER

[75] Inventors: Kouichi Asakura, Tokyo; Junichi Miwa, Yokohama, both of Japan

[73] Assignee: Kabushiki Kaisha Toshiba, Kawasaki, Japan

[21] Appl. No.: 347,085

[22] Filed: May 4, 1989

[30] Foreign Application Priority Data

May 13, 1988 [JP] Japan .................. 63-116697

[51] Int. Cl.⁵ .......................................... H01L 29/747
[52] U.S. Cl. ........................................ 357/39; 357/38; 357/37; 357/86
[58] Field of Search .................... 357/38, 39, 37, 38 E, 357/38 G, 39 E, 39 G, 39 C, 39 R, 39 T, 39 L, 39 LA, 86

[56] References Cited

U.S. PATENT DOCUMENTS

| 4,286,279 | 8/1981 | Hutson | 357/39 |
| 4,529,998 | 7/1985 | Lade et al. | 357/38 |
| 4,611,128 | 9/1986 | Patalong | 357/86 X |
| 4,635,086 | 1/1987 | Miwa et al. | 357/38 |

FOREIGN PATENT DOCUMENTS

| 0025291 | 3/1981 | European Pat. Off. |
| 3118317 | 11/1982 | Fed. Rep. of Germany |
| 56-55070 | 5/1981 | Japan |
| 57-32912 | 7/1982 | Japan |
| 58-3280 | 1/1983 | Japan |
| 2135511 | 8/1984 | United Kingdom |

OTHER PUBLICATIONS

Ghandhi, *Semiconductor Power Devices; Physics of Operation And Fabrication Technology*, Wiley, New York, 1977, pp. 220-221.

Wolley et al, "Characteristics of a 200 Gate Turn-Off Thyristor," *IEEE Conference Record of IAs 1973 Eight Annual Meeting of the IEEE Industry Applications Society*, Oct. 8-Oct. 11, 1973, Milwaukee, Wisconsin, pp. 251-254.

*Primary Examiner*—William Mintel
*Attorney, Agent, or Firm*—Finnegan, Henderson, Farabow, Garrett, and Dunner

[57] ABSTRACT

When a positive gate trigger signal is applied to a gate terminal of a gate-controlled bidirectional semiconductor switching device, a first auxiliary thyristor, made up of an n-type 7th layer, a p-type 4th layer, an n-type first layer, and a p-type 8th layer, is turned on, and a resultant on-current of the thyristor is fed as a gate current, through a second wiring, to a first main thyristor made up of an n-type 5th layer, a p-type second layer, an n-type first layer, and a p-type 8th layer, turning on the first main thyristor. When a negative gate trigger signal is applied to the gate terminal, a second auxiliary thyristor, made up of an n-type 6th layer, a p-type third layer, an n-type first layer, and a p-type 8th layer, is turned on. In this case, however, a rectifier prevents an on-current of the second auxiliary thyristor from flowing to the gate terminal through the 4th layer, and, as a result, the on-current is fed, without leakage, as a gate current to the first main thyristor. Accordingly, the reactive current components in the second auxiliary thyristor are reduced, and the first main thyristor is turned on.

8 Claims, 3 Drawing Sheets

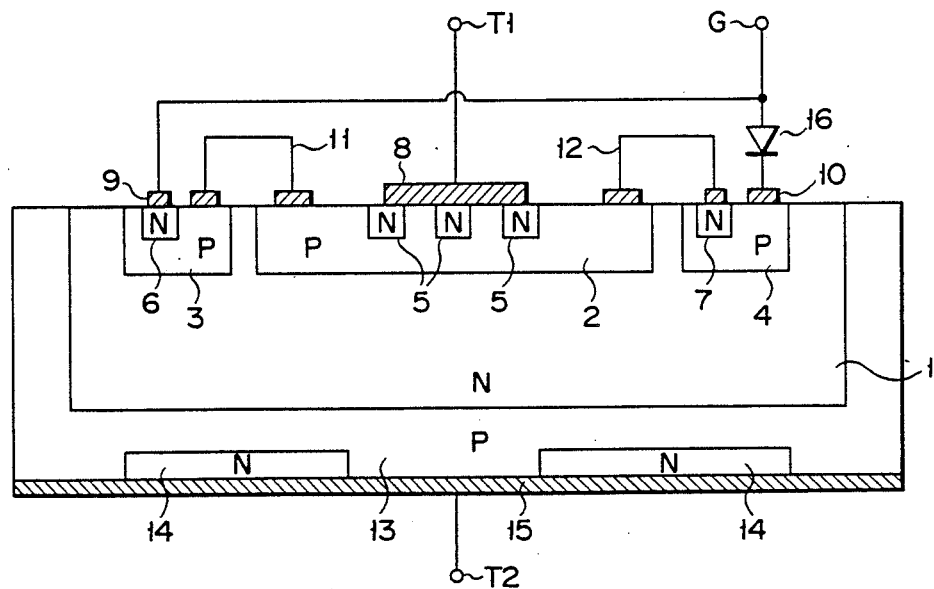
F I G. 2

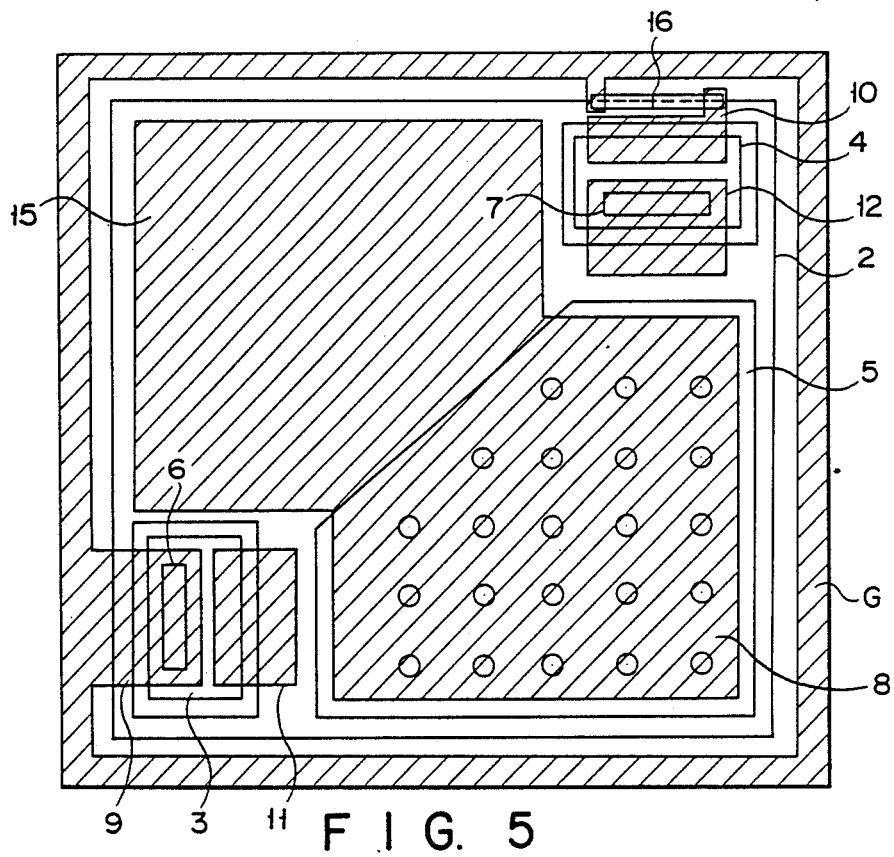
F I G. 5
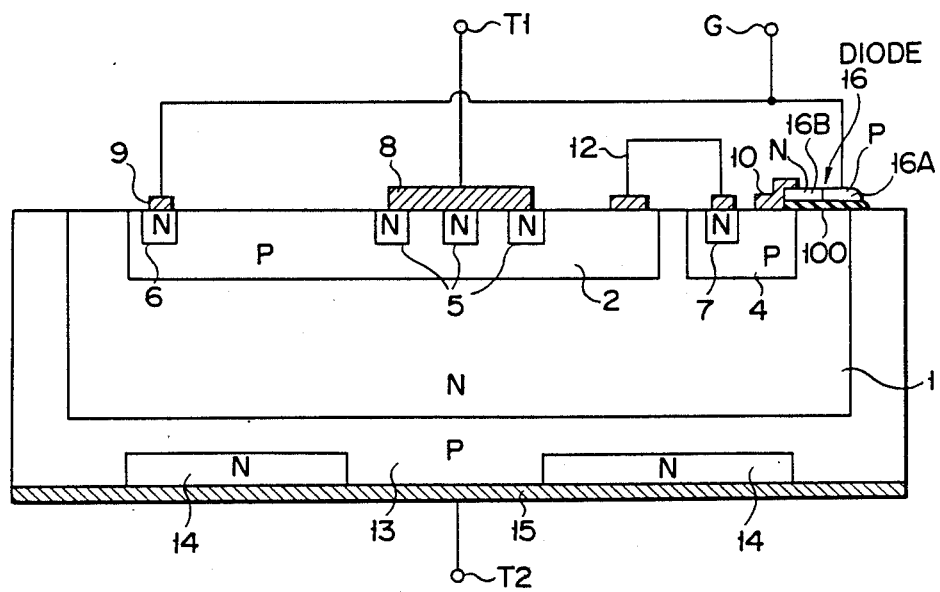
F I G. 6

GATE-CONTROLLED BIDIRECTIONAL SEMICONDUCTOR SWITCHING DEVICE WITH RECTIFIER

BACKGROUND OF THE INVENTION

1. Field of the Invention

This invention relates to a gate-controlled bidirectional semiconductor switching device such as a triac and, more particularly, to the improvement of the gate sensitivity thereof.

2. Description of the Related Art

A conventional triac is a type of bidirectional semiconductor switching device and is formed to have a cross section such as is shown in FIG. 1. In FIG. 1, numeral 30 denotes an n-type layer, 31 and 32 p-type layers, and 33, 34, 35 and 36 n-type layers. An electrode T1 is formed in contact with the p-type layer 31 and the n-type layer 33, a gate electrode G is formed in continuous contact with the n-type layer 34 and the p-type layer 31, an electrode T2 is formed in continuous contact with the p-type layer 32 and the n-type layers 35 and 36.

The gate electrode G and a portion of the p-type layer 31 situated under the gate electrode G make up the gate structure of a thyristor. A first and a second npn transistor together make up a remote gate structure, the first npn transistor being made up of the n-type layer 33, p-type layer 31, and the n-type layer 30, and the second npn transistor being made up of the n-type layer 34, p-type layer 31, and n-type layer 30. In addition, the n-type layer 34 and the p-type layer 31 make up a junction gate structure.

Four modes, I, II, III, and IV, are provided for turning on the triac having the construction described above. In mode I, the gate structure of the thyristor is used to turn on the triac; that is, the triac is turned on by applying a positive trigger to the gate electrode G when the electrodes T1 and T2 are respectively set at positive and negative potentials. In mode II, the junction gate structure is used, and the triac is turned on by applying a negative trigger to the gate electrode G when the electrodes T1 and T2 are set respectively at positive and negative potentials. In mode III, the remote gate structure is used, and the triac is turned on by applying a negative trigger to the gate electrode G when the electrodes T1 and T2 are set respectively at negative and positive potentials, and lastly, in mode IV, the remote gate structure is used, and the triac is turned on by applying a positive trigger to the gate electrode G when the electrodes T1 and T2 are set respectively at negative and positive potentials.

In order to increase the gate sensitivity of the conventional triac shown in FIG. 1, it is necessary to reduce an invalid current component, this being a current which flows along the surface of a p-type base formed of the p-type layer 31 and does not contribute to an injection current. For this purpose, attempts have been made to increase the resistance of a surface layer of the p-type layer 31 by lowering the impurity concentration thereof, or to interrupt the current flow in the p-type layer 31 by forming an n-type barrier layer therein. In either case, however, it has been found that the gate sensitivity cannot be increased without degrading other main characteristics. For example, any increase in the gate sensitivity is accompanied by a deterioration of the high temperature characteristics, a reduction in the critical rate of rise of the off-state voltage, or dv/dt, at the time of commutation (referred to as a dv/dt value), and the like. Further, from the standpoint of the operational principle of the triac, an emitter formed of the n-type layer 33 must be in the shorted structure, thereby limiting the degree of sensitivity which can be attained by fine control of the impurity diffusion.

Thus, for the above reasons, it has hitherto been difficult to improve the gate sensitivity of the conventional triac to such a degree that the triac can be directly driven by an output signal of a semiconductor integrated circuit (IC), and as described above, in the case of the conventional gate-controlled bidirectional semiconductor switching device, it has proved difficult to increase the gate sensitivity without lowering such characteristics as the dv/dt value.

SUMMARY OF THE INVENTION

Accordingly, an object of the present invention is to provide a gate-controlled bidirectional semiconductor switching device which can provide an increased gate sensitivity without any reduction in the dv/dt value.

According to the present invention, there is provided a gate-controlled bidirectional semiconductor switching device comprising: a first conductive layer of a first conductivity type; second to fourth conductive layers of a second conductivity type, which are formed separately in a first surface area of the first conductive layer; fifth to seventh conductive layers, of the first conductivity type, respectively formed in the surface areas of second to fourth conductive layers; an eighth conductive layer, of the second conductivity type, formed in a second surface area of the first conductive layer; a ninth conductive layer, of the first conductivity type, formed in the surface area of the eighth conductive layer; a first electrode layer, formed in continuous contact with the second and fifth conductive layers; first and second gate electrodes respectively formed in contact with the fourth and sixth conductive layers; a gate terminal coupled with the second gate electrode; a rectifier section connected between the gate terminal and the first gate electrode, the rectifier means allowing a current to flow from the gate terminal to the fourth conductive layer and prohibiting a current from flowing from the fourth conductive layer to the gate terminal; a first wiring, for connecting the second and third conductive layers to each other; a second wiring, for connecting the second and seventh conductive layers to each other; and a second electrode layer, formed in continuous contact with the eighth and ninth conductive layers.

When a positive gate trigger is applied to the gate terminal of the gate-controlled bidirectional semiconductor switching device of the invention, a first auxiliary thyristor, made up of the first, fourth, seventh, and eighth conductive layers, is turned on, and the on-current of the thyristor is supplied as a gate current to a first main thyristor made up of the first, second, fifth, and eighth conductive layers, thereby turning this thyristor on too. When, on the other hand, a negative gate trigger signal is applied to the gate terminal, a second auxiliary thyristor, which is made up of the first, third, sixth, and eighth conductive layers, is turned on. However, in this case, the rectifier section prevents the on-current of the second auxiliary thyristor from flowing through the 4th conductive layer to the gate terminal, and as a result, the on-current is fed as a gate current to the first main thyristor. Accordingly, an invalid current component in the second auxiliary thyristor is reduced, and the first main thyristor is turned on.

BRIEF DESCRIPTION OF THE DRAWINGS

FIG. 2 is a cross sectional view showing a triac according to a first embodiment of the present invention;

FIG. 5 is another plan pattern view of the triac shown in FIG. 3; and

FIG. 6 is a cross sectional view showing a triac according to a second embodiment of the present invention.

DETAILED DESCRIPTION OF THE PREFERRED EMBODIMENTS

Figure 1:
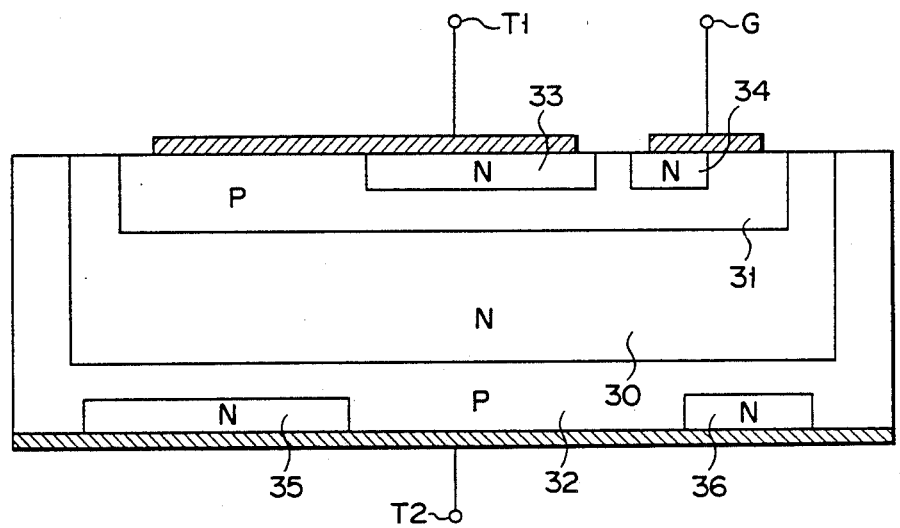
FIG. 1 is a cross sectional view showing a conventional triac.

FIG. 2 is a cross sectional view showing the element structure of a gate-controlled bidirectional semiconductor switching device of this invention, which is constructed in the form of a triac. The triac shown in FIG. 2, and for obtaining approximately 600 V of the peak inverse voltage level, is formed by means of an n-type semiconductor substrate 1 which has a thickness of 250 um and a resistivity of 40 $\Omega$-cm, and by utilizing a well known conventional oxide technique, an impurity diffusion technique, and lithography technology.

The p-type layers 2, 3, and 4, shown in FIG. 2, are formed separately in one surface region of the n-type substrate 1, the surface impurity concentration of each being set at $1 \times 10^{17}$ to $2 \times 10^{17}/cm^2$, and the diffusion depth of each being set at 40 to 50 um. The n-type layers 5, 6, and 7, also shown in this figure, are formed in p-type layers 2, 3, and 4, respectively, and their surface impurity concentration is set at a value of the order of $10^{21}/cm^2$, and the diffusion depth of each is set below 20 um.

An electrode layer 8 is formed in continuous contact with the surfaces of both the p-type layer 2 and the n-type layer 5, and has a first terminal T1 connected thereto. Gate electrode layers 9 and 10 are formed in the surfaces of the n-type layer 6 and the p-type layer 4, respectively. A gate terminal G for receiving a gate trigger signal from an external source is directly connected to the gate electrode layer 9, and through a pn junction diode 16 to the gate electrode layer 10. A diode 16, for blocking a current flow from the p-type layer 4 to the gate terminal G, is connected at the anode to the gate terminal G and at the cathode to the gate electrode layer 10. The surface of the p-type layer 2 is connected to that of p-type layer 3 through a wiring 11, and to the surface of n-type layer 7 through a wiring 12.

A p-type layer 12 is formed in the other surface region of the n-type substrate 1. Like the p-type layers 2, 3, and 4, the surface impurity concentration and the diffusion depth of the p-type layer 12, are set at $1 \times 10^{17}$ to $2 \times 10^{17}/cm^2$ and 40 to 50 um, respectively. An n-type layer 14 is formed in the surface of the p-type layer 13, and like the n-type layers 5, 6, and 7, has a surface impurity concentration in the order of $10^{21}/cm^2$ and a diffusion depth of 20 um or less. An electrode layer 15 is formed in continuous contact with the surfaces of the p-type layer 13 and the n-type layer 14, and has a second terminal T2 connected thereto.

The n-type layer 5, p-type layer 2, n-type substrate 1, and p-type layer 13 make up a first main thyristor allowing a current flow from the first terminal T1 to the second terminal T2; the n-type layer 14, p-type layer 13, n-type substrate 1, and p-type layer 2 form a second main thyristor allowing a current flow from the second terminal T2 to the first terminal T1; the n-type layer 7, p-type layer 4, n-type substrate 1, and p-type layer 13 constitute a first auxiliary thyristor which operates in response to a positive gate trigger signal; and the n-type layer 6, p-type layer 3, n-type substrate 1, and p-type layer 13 make up a second auxiliary thyristor which operates in response to a negative gate trigger signal.

The operation of the gate-controlled bidirectional semiconductor switching device constructed thus will now be described.

The operation of the switching device in mode I (the terminal T1 and the gate terminal G are both positive) is the same as that of a normal thyristor. When a positive gate trigger signal is applied to the gate terminal G, this signal is supplied to the p-type layer 4, through the diode 16 and the gate electrode 10, and as a result, carriers are injected from the n-type layer 7 to the p-type layer 4, turning on the first auxiliary thyristor which is constituted by the n-type layer 7, p-type layer 4, n-type substrate 1, and p-type layer 13. Since, in this case, the gate electrode 10 is not connected to the n-type layer 7, but only to the p-type layer 4, the positive trigger signal from the gate terminal G is supplied to the p-type layer 4 of the first auxiliary thyristor, and a resultant on-current of this thyristor is supplied as a gate current to the p-type layer 2, through the wiring 12. Thereafter, carriers are injected from the n-type layer 5 to p-type layer 2, to turn on the first main thyristor made up of the n-type layer 5, p-type layer 2, n-type substrate 1, and p-type layer 13. As a result, a current flows from the terminal T1 to the terminal T2.

For example, the first auxiliary thyristor is turned on by a gate current of about several microamperes from the gate terminal G. An on-current of the first auxiliary thyristor is a maximum of several hundreds milliamperes. The value of the on-current is enough to turn on the first main thyristor. Accordingly, the gate sensitivity of the triac in mode I can be improved significantly.

The operation of the switching device in mode II (the terminal T1 is positive and the gate terminal G is negative) is also the same as that of a normal thyristor. When a negative gate trigger signal is applied to the gate terminal G, the gate trigger signal is applied through the gate electrode 9 to the n-type layer 6. As a result, carriers are injected from n-type layer 6 to the p-type layer 3, to turn on the second auxiliary thyristor made up of the n-type layer 6, p-type layer 3, n-type substrate 1, and p-type layer 13. An on-current of the second auxiliary thyristor is first supplied to a gate circuit (not shown) connected to the gate terminal G, and is limited by the gate resistor of the gate circuit. When the gate potential is set positive with respect to a potential at the terminal T1, the on-current is applied as a gate current to the p-type layer 2 through the wiring 11. Afterwards, as in mode I, carriers are injected from the n-type layer 5 to p-type layer 2, to turn on the first main thyristor comprised of the n-type layer 5, p-type layer 2, n-type substrate 1, and p-type layer 13. Consequently, a current flows from the terminal T1 to the terminal T2.

When the second auxiliary thyristor is turned on, not only a pnp transistor made up of the p-type layer 3, n-type substrate 1, and p-type layer 13 in the second thyristor is turned on, but also a condition for turning on a pnp transistor made up of the p-type layer 4, n-type substrate 1 and p-type layer 13 in the first auxiliary thyristor is satisfied. If the diode 16 is not provided, a part of the on-current of the second auxiliary thyristor flows into the negative gate terminal G through the pnp transistor in the first auxiliary thyristor. This will cause a decrease of the gate sensitivity in mode II. Since the triac according to the present invention is provided with the diode 16, however, the partial flow of the on-current to the gate terminal G can be prevented by the diode 16. Accordingly, the on-current of the second auxiliary thyristor is fed to the first main thyristor without any leakage of current. The result is a further improvement of the gate sensitivity in mode II.

In mode III (terminal T1 is negative, and the gate terminal G is also negative), a negative trigger signal is applied to the gate terminal G. An npn transistor made up of the n-type layer 6, p-type layer 3, and n-type substrate 1 executes a gate trigger operation. In this operation, the electrons are injected from the n-type layer 6 to the p-type layer 3 reach the n-type substrate 1, to forwardly bias the p-type layer 3 and the n-type substrate 1. As a result, holes are injected from the p-type layer 3 to the n-type substrate 1 and reach the p-type layer 13. The holes vertically flow in the p-type layer 13. A voltage drop caused in the p-type layer 13 at this time injects electrons from n-type layer 14 to the p-type layer 13. In turn, the second thyristor made up of the p-type layer 2, n-type substrate 1, p-type layer 13 and n-type layer 14 is turned on. The above gate trigger operation is called the remote gate operation.

In mode IV (the terminal T1 is negative, and the gate terminal G is positive), a positive gate trigger signal is applied to the gate terminal G. The gate trigger signal is supplied to the p-type layer 4, through the diode 16 and the gate electrode 10. Then, an npn transistor made up of the n-type layer 7, p-type layer 4, and n-type substrate 4 executes the remote gate operation, to turn on the second main thyristor made up of the p-type layer 2, n-type substrate 1, p-type layer 13 and n-type layer 14, as in mode III. Also in modes III and IV, the invalid components of the gate current of each auxiliary thyristor are reduced. Accordingly, the gate sensitivity is improved.

As described above, the triac according to the first embodiment of the present invention succeeds in improving the gate sensitivity in modes I to IV. Particularly, the gate sensitivity in mode II is improved by means of the diode 16.

In each mode I to IV, a gate driving critical current as a minimum gate current necessary for driving the first and second auxiliary thyristors may be set at several microamperes. The output current of a normal IC is about 5 mA. This fact indicates that the triac according to the present invention can be driven by the output current of the normal IC.

Since, the main thyristors and the auxiliary thyristors are formed separately, the triac is free from the dv/dt value at the time of commutation. As described above, according to this invention, it is possible to provide a gate-controlled bi-directional semiconductor switching device in which the gate sensitivity can be enhanced without degrading such characteristics as the dv/dt value.

Figure 3:
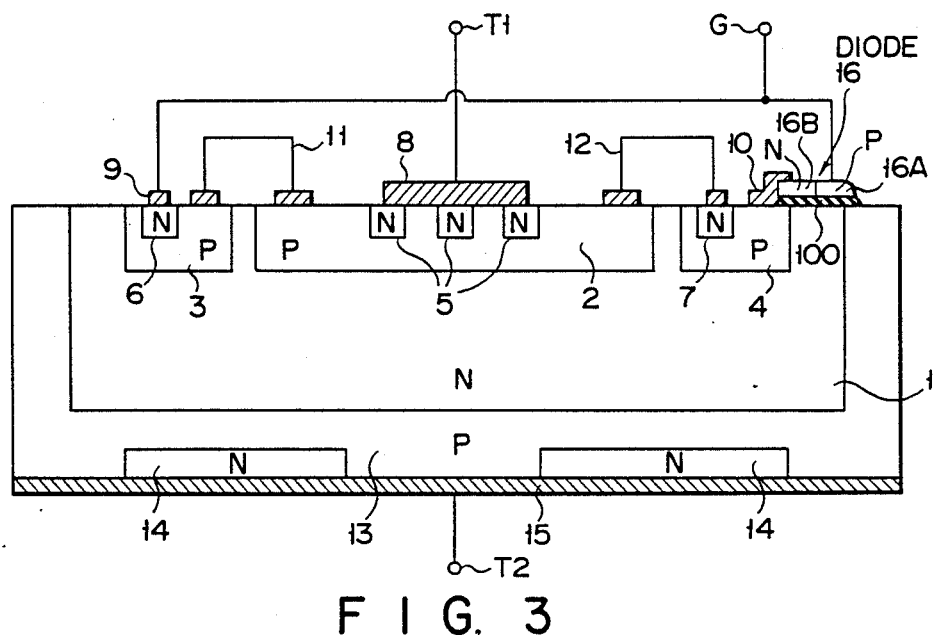
FIG. 3 is a cross sectional view showing a state wherein a pn junction diode of the triac shown in FIG. 2 is formed integral with a triac substrate.

FIG. 3 shows a sectional view of a triac according to the present invention, in which the pn junction diode 16 is formed on the surface of the structure of the triac.

Figure 4:
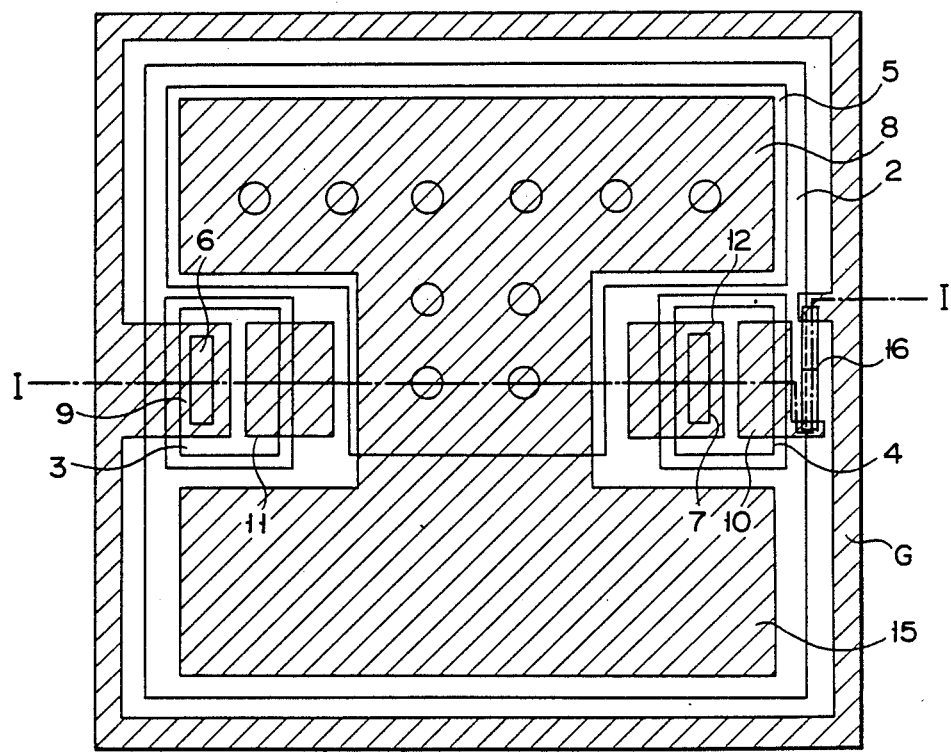
FIG. 4 is a plan pattern view of the triac shown in FIG. 3.

FIG. 4 shows a plan pattern of the device of FIG. 3. The illustration of FIG. 3 is taken on line I—I of FIG. 4. As shown in FIGS. 3 and 4, the diode 16 is formed on an insulating layer 100 laid on the surface of the triac structure. The diode 16 is formed of a polysilicon layer. A part of the polysilicon layer is doped with p-type impurity, while the remaining part is doped with n-type impurity. The p-type part is connected to the gate terminal G, and the n-type part is connected through the gate electrode 10 to the p-type layer 4.

In FIG. 3 showing the sectional view, the lead from the gate terminal G to the gate electrodes 9 and 10 is depicted as a signal solid line. In FIG. 4 showing the plan pattern, it is depicted as a continuous rectangular wire (denoted as G) enclosing the element region.

FIG. 5 shows a modification of the plan pattern of FIG. 4. In the plan pattern of FIG. 5, the p-type layers 3 and 4 are located at the diagonal corners of a rectangular element forming region.

FIG. 6 shows a sectional view of the structure of another triac to which a gate-controlled bidirectional semiconductor switching device according to the present invention is applied. In this second embodiment of the present invention, the p-type layer 3 in the second auxiliary thyristor and the p-type layer 2 of the main thyristor that are shown in FIG. 3 are formed by a single layer. Also in this structure, the gate electrodes 9 and 10 are respectively in contact with the n-type layer 6 and the p-type layer 4. The reduction of the reactive components in the auxiliary thyristors that are attained by the first embodiment may also be attained. In mode II, the diode 16 functions like that in the first embodiment. Therefore, the gate sensitivity in each mode can be improved without hampering dv/dt value at the time of commutation. The use of the single layer which is used for the p-type layers 3 and 2 leads to a reduction in the chip area.

What is claimed is:

1. A gate-controlled bidirectional semiconductor switching device comprising:
   a first conductive layer of a first conductivity type;
   second to fourth conductive layers, of a second conductivity type, which are formed separately in a first surface area of said first conductive layer;
   fifth to seventh conductive layers, of the first conductivity type, respectively formed in the surface areas of said second to fourth conductive layers;
   an eighth conductive layer, of the second conductivity type, formed in a second surface area of said first conductive layer;
   a ninth conductive layer, of the first conductivity type, formed in the surface area of said eighth conductive layer;
   a first electrode layer, formed in continuous contact with said second and fifth conductive layers;
   first and second gate electrodes respectively in contact with said fourth and sixth conductive layers;
   a gate terminal coupled with said second gate electrode;
   a rectifier means connected between said gate terminal and said first gate electrode, said rectifier means allowing a current to flow from said gate terminal to said fourth conductive layer, and prohibiting a current from flowing from said fourth conductive layer to said gate terminal;
   a first wiring, for connecting said second and third conductive layers to each other;

a second wiring, for connecting said second and seventh conductive layers to each other; and a second electrode layer, formed in continuous contact with said eighth and ninth conductive layers.

2. A gate-controlled bidirectional semiconductor switching device according to claim 1, in which said rectifying means includes a pn junction diode which is connected at the anode to said gate terminal and at the cathode to said first gate electrode.

3. A gate-controlled bidirectional semiconductor switching device according to claim 2, in which said pn junction diode is formed on an insulating layer laid on said first surface area of said first conductive layer.

4. A gate-controlled bidirectional semiconductor switching device according to claim 2 or 3, in which said pn junction diode contains a polysilicon layer, and one part of said polysilicon layer is doped with a p-type impurity, while the other part of said polysilicon layer is doped with an n-type impurity.

5. A gate-controlled bidirectional semiconductor switching device comprising:

a first conductive layer of a first conductivity type;

second and third conductive layers, of a second conductivity type, which are formed separately in a first surface area of said first conductive layer;

fourth and fifth conductive layers, of the first conductivity type, respectively formed in the surface area of said second conductive layer;

a sixth conductive layer, of the first conductivity type, formed in the surface area of said third conductive layer;

a seventh conductive layer, of the second conductivity type, formed in a second surface area of said first conductive layer;

an eighth conductive layer, of the first conductivity type, formed in the surface area of said seventh conductive layer;

a first electrode layer, formed in continuous contact with said second and fourth conductive layers;

first and second gate electrodes respectively formed in contact with said third and fifth conductive layers;

a gate terminal coupled with said second gate electrode;

a rectifier means connected between said gate terminal and said first gate electrode, said rectifier means allowing a current to flow from said gate terminal to said third conductive layer and prohibiting a current from flowing from said third conductive layer to said gate terminal;

a wiring connecting said second and sixth conductive layers to each other; and a second electrode layer, formed in continuous contact with said seventh and eighth conductive layers.

6. A gate-controlled bidirectional semiconductor switching device according to claim 5, in which said rectifying means includes a pn junction diode which is connected at the anode to the gate terminal and at the cathode to the first gate electrode.

7. A gate-controlled bidirectional semiconductor switching device according to claim 6, in which said pn junction diode is formed on an insulating layer laid on said first surface area of said first conductive layer.

8. A gate-controlled bidirectional semiconductor switching device according to claim 6 or 7, in which said pn junction diode contains a polysilicon layer one part which is doped with a p-type impurity, and the other part of which is doped with an n-type impurity.

* * * * *